United States Patent [19]

Tadayon et al.

[11] Patent Number: 5,183,779
[45] Date of Patent: Feb. 2, 1993

[54] METHOD FOR DOPING GAAS WITH HIGH VAPOR PRESSURE ELEMENTS

[75] Inventors: Bijan Tadayon; Saied Tadayon, both of Germantown, Md.

[73] Assignee: The United States of America as represented by the Secretary of the Navy, Washington, D.C.

[21] Appl. No.: 695,018

[22] Filed: May 3, 1991

[51] Int. Cl.$^5$ ........................................ H01L 21/223
[52] U.S. Cl. .................................... 437/165; 437/105; 437/107; 437/167; 437/987; 148/DIG. 40
[58] Field of Search ............... 437/105, 106, 107, 165, 437/166, 167, 987; 148/DIG. 40, DIG. 56, DIG. 157, DIG. 169

[56] References Cited

U.S. PATENT DOCUMENTS

| | | | |
|---|---|---|---|
| 3,305,412 | 2/1967 | Pizzarello | 437/167 |
| 3,642,544 | 2/1972 | Keyes et al. | 437/167 |
| 3,901,746 | 8/1975 | Boucher | 437/107 |
| 3,979,235 | 9/1976 | Boucher | 148/DIG. 56 |
| 4,119,993 | 10/1978 | Hartnagel et al. | 148/DIG. 56 |
| 4,378,255 | 3/1983 | Holonyak, Jr. et al. | 437/107 |
| 4,592,793 | 6/1986 | Hovel et al. | 437/167 |
| 4,828,935 | 5/1989 | Jonker et al. | 437/22 |
| 4,855,013 | 8/1989 | Ohta et al. | 437/936 |
| 4,876,218 | 10/1989 | Pessa et al. | 437/107 |
| 4,935,385 | 6/1990 | Biegelsen | 148/DIG. 149 |

OTHER PUBLICATIONS

Tadayon et al. "Growth of GaAs at Low Substrate Temperatures, and the Possibility of Zinc Doping at Low Substrate Temperatures", 177th Electrochemical Society Meeting, Montreal, Quebec, CA (5/6-11/90).
Tadayon et al. "A Novel Method for the Growth of Good Quality GaAs at Extremely Low Substrate Temperatures (as Low as 120° C.)", Journal of Vacuum Science & Technology B, vol. 8, No. 2, 131 (Mar. 1990).
Tadayon et al. "Reduction of Be Diffusion in GaAs by Migration-Enhanced Epitaxy", Applied Physics Letters, vol. 55, 59 (1989).
Shtrikman et al. "High-Mobility Inverted Selectively Doped Heterojunctions", J. Vac. Sci. Technol. B, vol. 6, 670 (1988).
Tadayon et al. "Growth of GaAs-Al-GaAs by Migration-Enhanced Epitaxy", Applied Physics Letters, vol. 53, 2664 (1988).
Kaminska et al. "Structural Properties of As-rich GaAs Grown by Molecular Beam Epitaxy at Low Temperatures", Applied Physics Letters, vol. 54, 1881 (1989).
Smith et al, "New MBE Buffer used to Eliminate Backgating in GaAs MESFETs", IEEE Electron Device Letters, vol. 9, 77 (1988).
Horikoshi et al. "Low Temeprature Growth of GaAs and AlAs-GaAs Quantum Well Layers by Modified MBE", Japan J. Appl. Phys., vol. 25, L868 (1986).
Juang et al. "Growth and Properties of InAlAs/InGaAs, GaAs:In and InGaAs/GaAs Multilayers", J. Crystal Growth, vol. 81, 363 (1987).
Missous et al. "Electrical Properties of Indium Doped GaAs Layers Grown by MBE", J. Crystal Growth, vol. 81, 314 (1987).
Metze et al. "Effects of Very Low Growth Rates on GaAs Grown by MBE at Low Substrate Temperatures", Appl. Phys. Lett., vol. 42, 818 (1983).
Tadayon et al. "Increase in Electrical Activation and Mobility of Si-diped GaAs, Grown at Low Substrate Temperatures, by the Migration-Enhanced Epitaxy Method", J. Appl. Phys., vol. 67, No. 1, pp. 589-591, Jan. 1990.
Raiston et al. "Intermixing of $Al_xGa^{1-x}Ag/GaAs$ Superlatices by Pulsed Laser Irradiation", Appl. Phys. Lett., vol. 50, No. 25, 1817 (Jun. 22, 1987).

Primary Examiner—Brian E. Hearn
Assistant Examiner—C. Chaudhari
Attorney, Agent, or Firm—Thomas E. McDonnell; George A. Kap

[57] ABSTRACT

A method is disclosed for the incorporation of relatively high vapor pressure elements into good quality GaAs at extremely low $T_s$ using the migration enhanced epitaxy techinque. Zinc was doped in GaAs material grown at a low $T_s$ of 120° C. Zinc may thus be used as a p-type dopant replacing more toxic Be. Similarly, other high vapor pressure elements can be incorporated much more efficiently into the material grown at low $T_s$.

32 Claims, 2 Drawing Sheets

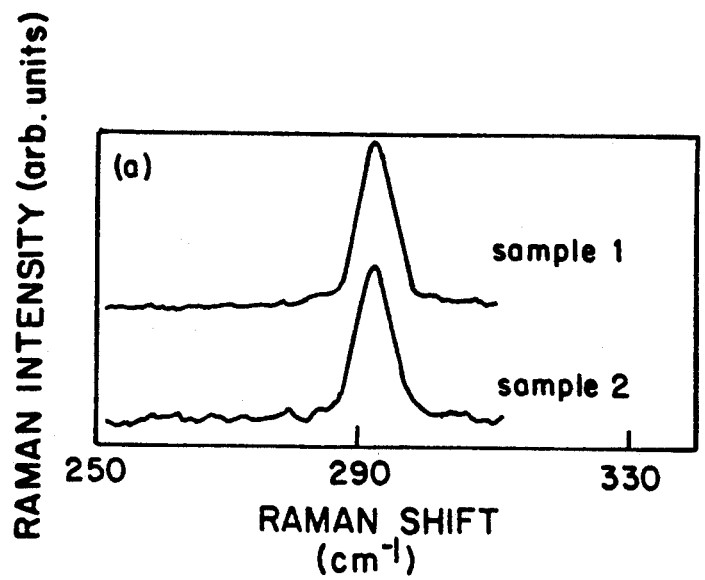
Raman spectra of the samples 1 and 2
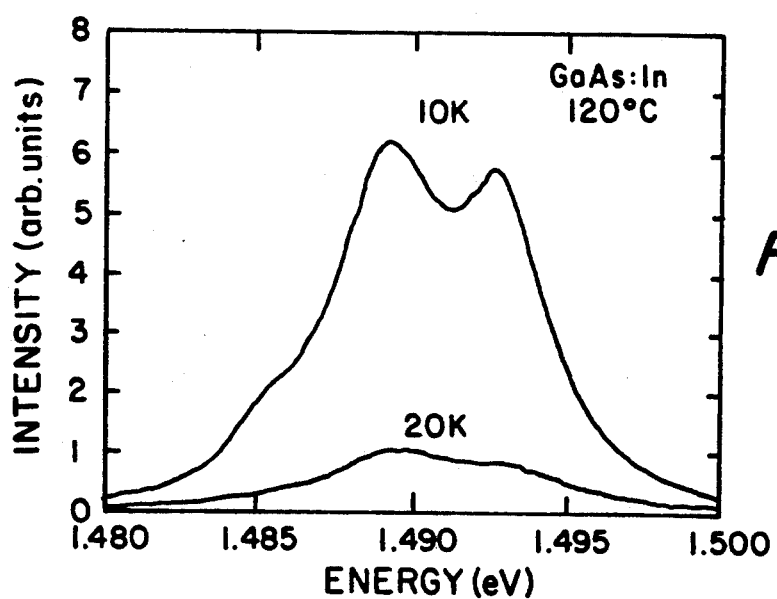
The 10K and 20K PL spectra of In doped GaAs

METHOD FOR DOPING GAAS WITH HIGH VAPOR PRESSURE ELEMENTS

FIELD OF THE INVENTION

The invention is in the field of molecular beam epitaxy (MBE) and is especially directed to doping GaAs with a high vapor pressure element utilizing a migration enhanced epitaxy (MEE) technique.

BACKGROUND OF THE INVENTION

The following references are pertinent to the background of the invention and are incorporated herein by reference.

(1) Tadayon et al., "Growth of GaAs at Low Substrate Temperatures, and the Possibility of Zinc Doping at Low Substrate Temperatures", 177th Electrochemical Society Meeting, Montreal, Quebec, Canada (May 6-11, 1990).

(2) Tadayon et al., "A Novel Method for the Growth of Good Quality GaAs at Extremely Low Substrate Temperatures (as Low as 120° C.)", Journal of Vacuum Science and Technology B, Vol. 8, No. 2, 131 (March 1990).

(3) Tadayon, et al., "Reduction of Be Diffusion in GaAs by Migration-Enhanced Epitaxy", Applied Physics Letters, Vol. 55, 59 (1989).

(4) Shtrikman, et al., "High-Mobility Inverted Selectively Doped Heterojunctions", J. Vac. Sci. Technol. B, Vol. 6, 670 (1988).

(5) Tadayon, et al., "Growth of GaAs-Al-GaAs by Migration-Enhanced Epitaxy", Applied Physics Letters, Vol. 53, 2664 (1988).

(6) Kaminska, et al., "Structural Properties of As-rich GaAs Grown by Molecular Beam Epitaxy at Low Temperatures", Applied Physics Letters, Vol. 54, 1881 (1989).

(7) Smith, et al., "New MBE Buffer Used to Eliminate Backgating in GaAs MESFETs", IEEE Electron Device Letters, Vol. 9, 77 (1988).

(8) Horikoshi, et al., "Low Temperature Growth of GaAs and AlAs-GaAs Quantum Well Layers by Modified MBE", Japan J. Appl. Phys., Vol. 25, L868 (1986).

(9) Juang, et al., "Growth and Properties of InAlAs/InGaAs, GaAs:In and InGaAs/GaAs Multilayers", J. Crystal Growth, Vol. 81, 373 (1987).

(10) Missous, et al., "Electrical Properties of Indium Doped GaAs Layers Grown by MBE", J. Crystal Growth, Vol. 81, 314 (1987).

(11) Metze, et al., "Effects of Very Low Growth Rates on GaAs Grown by MBE at Low Substrate Temperatures", Appl. Phys. Lett., Vol. 42, 818 (1983).

(12) Tadayon, et al., "Increase in Electrical Activation and Mobility of Si-doped GaAs, Grown at Low Substrate Temperatures, by the Migration-Enchanced Epitaxy Method", J. Appl. Phys. Vol. 67, 589 (1990).

(13) Raiston, J. et al., "Intermixing of $Al_xGa^{1-x}As$/GaAs Superlatices by Pulsed Laser Irradiation", Appl. Phys. Lett., Vol 50, No. 25, p. 1817, Jun. 22, 1987.

Molecular beam epitaxy (MBE) is a highly controlled ultrahigh vacuum deposition process in which thermal beams of molecules or atoms are directed onto a heated substrate. A standard MBE chamber is illustrated in FIG. 1. The MBE chamber is provided with a plurality of furnaces or effusion cells 2 each having a narrow opening 4 which is closed off from or opened to the interior region of the chamber by means of individually controllable shutters 6. The constituents of the various elements desired to be grown are placed in the individual furnaces 2 and heated to vapor conditions. Thermal molecular or atomic beams of these constituents emerge when the shutters are opened, and these beams impinge onto a substrate 10 which is heated to a substrate temperature, $T_s$, by means of heating element 12. The entire chamber is evacuated to low pressures before and during the beam deposition. The MBE technique permits the growth of highly reproducible and extremely thin epitaxial layers of III-V compounds on large wafer areas. MBE has also been used for group II-VI and IV—IV compounds and for silicon.

Gallium arsenide, GaAs, is a widely used semiconductor material which is grown using MBE techniques. Conventional MBE growth of GaAs is done at substrate temperatures close to 600° C., in an As-rich condition, with a growth rate of about 1 micron per hour, and with the As and Ga shutters open simultaneously.

Semiconductor material such as GaAs are often doped with p-type or n-type materials for use in semiconductor devices. Be is a typical p-type dopant and is used in the MBE technique. However, other materials would be desirable to use in place of Be because Be is extremely toxic. For example, it would be desirable to use Zn to replace Be as a p-type dopant in GaAs. However, Zn has a relatively high vapor pressure and would not be suitable for use in conventional MBE techniques where the substrate temperature is relatively high, e.g., $T_s$ on the order of 600° C., since at such high temperatures Zn will not stick to the GaAs surface.

One way to dope GaAs with a high vapor pressure element (such as zinc), is ion implantation. But ion implantation has three disadvantages:

(1) ion implantation produces damage in the crystal, even after annealing;

(2) the doping profiles are not flat; and (3) it is impossible to have abrupt doping profiles.

Therefore, it is very desirable to find a method other than ion implantation to grow good quality GaAs and to be able to use a high vapor pressure material, such as Zn, as the dopant.

SUMMARY OF THE INVENTION

In accordance with the principles of the invention, there is provided a method of doping a relatively high vapor pressure element into semiconductor materials which are deposited on a substrate using a molecular beam epitaxy chamber. The method comprises:

1) a first diffusion step of diffusing a first semiconductor material onto the substrate to form a first diffusion layer;

2) a second diffusion step, performed after completion of said first diffusion step, of diffusing a second semiconductor material onto the first diffusion layer to form a second diffusion layer;

3) a third diffusion step of diffusing the high vapor pressure element onto at least one of said first and second layers; and 4) heating the substrate to no more than a relatively low temperature during at least the third diffusion step so as to permit the element to bond to crystal sites of the semiconductor material.

The utilization of the principles of the invention permits a whole new area of device fabrication to be considered. Previously, all high vapor pressure elements have been disregarded as possible dopants for GaAs, AlAs etc. grown in molecular beam epitaxy machines.

However, using the principles of the invention, the choice of dopants widely enlarges as does their use in many diverse device applications, such as heterojunction bipolar transistors, lasers, and field effect transistors. These devices are used in different applications, such as microwave, digital, Navy communications, and Navy optoelectronics.

BRIEF DESCRIPTION OF THE DRAWINGS

FIG. 2 illustrates the Raman spectra of two samples of the doped semiconductor made in accordance with the invention; and FIG. 3 shows the 10K and 20K PL spectra of the doped semiconductor made in accordance with the invention.

DETAILED DESCRIPTION OF THE PREFERRED EMBODIMENTS

Figure 1:
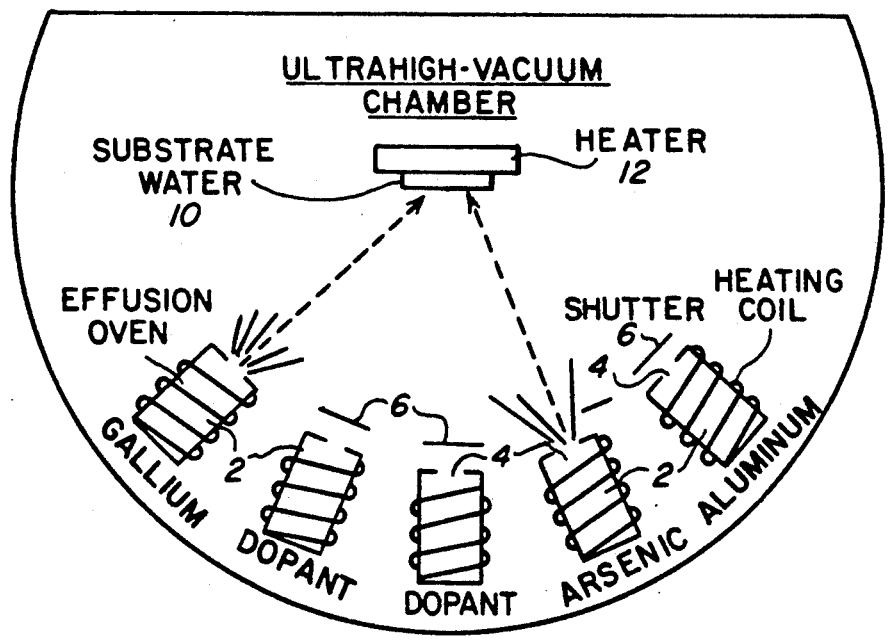
FIG. 1 shows a diagram of a conventional MBE chamber which may be used in accordance with the invention.

In order to utilize a relatively high vapor pressure dopant material, a modified MBE method was utilized while still employing the same physical structure of the conventional MBE chamber as shown in FIG. 1. The modified technique is known as the migration enhanced epitaxy (MEE) method and is described in Ref (8) above. In utilizing the MEE method, low substrate temperatures, $T_s = 200°$ C. are utilized in growing GaAs while still obtaining a high quality semiconductor growth. The purpose of the low temperature as described in Ref (8) was to obtain sharp doping profiles for both n— and p— materials in GaAs and AlAs layers and to enable development of processing technologies including the growth of finely structured layers.

In accordance with the principles of the invention, the MEE technique may also be utilized to dope high vapor pressure elements onto the surface being grown on the substrate.

In the MEE method, the Ga and As shutters are opened one at a time in a cyclic, non-overlapping manner. As a result, the Ga surface diffusion length becomes very large, even at low substrate temperatures making possible the growth of good quality GaAs at low substrate temperatures. The low substrate temperatures are important for the high vapor pressure materials since it is only at these relatively low temperatures that the high vapor pressure materials will have a sufficiently high sticking coefficient to bind on the layers being grown.

If the conventional MBE technique is used at low temperatures, e.g., 100°-400° C., the Ga and As will stick to the substrate surface and form an amorphous layer. Such does not happen in the MEE technique. Without being committed to the particular theory of operation, it is believed that the tendency of the Ga to lump together in the conventional MBE technique results in part from the lower mobility of the Ga in the presence of As. Thus, the advantage of utilizing the MEE technique is to permit a cycle time with only Ga present on the substrate surface permitting the Ga atoms to have a higher mobility. The higher mobility is particularly advantageous at lower temperatures since the lower temperature will generally result in a lower mobility. The two effect do not exactly cancel out and the effect of the absence of As appears to be more important. The low temperature MEE cycle thus permits the Ga to have a high enough mobility so that the Ga atoms are sufficiently migratory so as to find appropriate crystal sites on which to bind. This binding ability is augmented by the relatively low rate at which the Ga is selected to strike the surface in the disclosed MEE technique so that the Ga atoms have more time to find binding sites before the As is utilized. The rate at which the Ga and As strike the substrate surface is controllable by controlling the pressure and temperature inside the individual furnaces 2.

A working example is set forth below to specify a set of growth parameters and conditions for the growth of good quality GaAs at extremely low substrate temperatures (120° C.), using the MEE.

The starting substrate material is made of semi-insulating GaAs and is placed in the MBE chamber for adding additional layers of Ga and As together with the zinc dopant.

A low growth rate of 0.1 μm/h (nominal) was used, which means that the Ga beam flux intensity was set at $6.4 \times 10^{13}$ cm$^{-2}$s$^{-1}$. The Ga furnace temperature was calibrated by the conventional reflection high-energy electron diffraction (RHEED) intensity oscillation measurements. In general, the range of growth rate between 0.05 and 0.2 μm/h (nominal) is suitable.

To obtain the appropriate As coverage, the As beam flux intensity was set at $1.7 \times 10^{14}$ cm$^{-2}$s$^{-1}$. Zinc was provided as an impurity in both the Ga and As charges, and thus a thermal Zn impinged on the substrate together with both the As beam as well as the Ga beam.

The Ga and As shutters were opened one at a time (cyclically). The Ga and As shutters were opened for 10 and 2 seconds, respectively. Ten seconds of Ga with a beam flux intensity of $6.4 \times 10^{13}$ cm$^{-2}$s$^{-1}$, deposits $6.4 \times 10^{14}$ cm$^{-2}$ of Ga atoms on the surface. A single monolayer of GaAs doped with Zn results from each Ga—As shutter cycle. Typically, many cycles are used to build up a plurality of monolayers. A final layer of many thousands (e.g., 10,000) of monolayers may be grown. The GaAs was doped with about 0.14% of indium ($Ga_{0.9986}In_{0.0014}As$). The indium was deposited only when the Ga shutter was open, so that the indium would be in the Ga plane.

The addition of a small amount of indium to GaAs (In doped GaAs) in the MEE method reduces trap and defect densities in GaAs, and thus leads to improved crystal quality. The improvement is partially due to the higher surface migration rate of In atoms, as compared to Ga atoms. Although not essential, In is advantageous.

The crystal quality of the samples were examined by Raman spectroscopy, 4K PL, photoreflectance, and transmission electron microscopy (TEM). Raman spectroscopy was performed on a (100) surface in the backscattering configuration, using the 488 nm line of an argon laser.

FIG. 2 shows the Raman spectra of two samples. Sample 1 is GaAs without the In dopant, grown at 150° C. by the MEE method at low growth rate. Sample 2 is In doped GaAs, grown at 120° C. by the MEE method at low growth rate. Both samples contain the Zn impurity. Since sample 1 is In undoped and sample 2 has a very small percentage of In, the Raman spectrum of both samples has only one peak near or at the GaAs longitudinal-optical (LO) phonon energy, see Ref.(13). Theoretically, the transverse-optical (TO) peak is forbidden on this crystal surface (which is (100)). Therefore, the lack of the TO peak in the Raman spectrum of both samples is an indication that both samples are good quality GaAs.

The TEM study showed some small features in the crystal, which are probably due to some nonuniformities in the crystal, caused by the extremely low growth temperature. The TEM study showed no dislocations, and there were only very few stacking faults.

Based on the results of Raman spectroscopy, 4K PL, photoreflectance, and TEM, the GaAs crystal quality is good, see Refs. (1, 2).

FIG. 3 shows the 10K and 20K PL spectra of In doped GaAs, grown at 120° C. by the MEE method at low growth rate, in the range of 1.48 to 1.50 eV. The two peaks in both of the spectra of FIG. 3 correspond to the free-bound transition for carbon and zinc impurities in GaAs. The peak at the lower energy corresponds to zinc. Note that the 10K and 20K PL spectra were considered together, to make sure that the peak at the lower energy corresponds to the free-bound transition for zinc. (This peak cannot correspond to the donor-acceptor transition for carbon because at 20K, the donors get ionized, yet the peak still exists. Thus the peak must correspond to zinc.)

From the above example, it will be apparent that the source of the Zn may evolve from its presence as an impurity in either the Ga, the As, or both. Since the amount of dopant material is small compared to the amount of Ga and As deposited on the substrate, the amounts of Zn found as impurities in these materials may be sufficient to obtain the desired dopant concentrations. However, it is readily apparent that a separate furnace 2 may be employed for the high vapor pressure material such as Zn. In this manner, the amount of Zn may be controlled to meet the design criteria of the desired semiconductor device to be produced. With a separate furnace to produce the Zn thermal beam, the Zn shutter may be opened simultaneously with either the Ga or As shutters; both the Ga and As shutters; or separately from both the Ga and As shutters.

In the example above, the growth temperature was 120° C. In general, a growth temperature in the range of 100°–150° C. is suitable for Zn with a preferred range of 120°–130° C. Depending on the vapor pressure, other elements may require different growth temperature ranges. The governing criteria for determining a suitable growth temperature range is, at the lower temperature limit, the lessening of the migration length of Ga on the substrate surface resulting in the build up of amorphous regions, and on the high temperature limit, the reduced sticking coefficient of the doped material due to the higher thermal energies on the substrate surface such that the dopant will no longer effectively bind to the semiconductor surface.

In conventional MBE techniques the substrate temperature is relatively high and thus any high vapor pressure element such as Zn striking the substrate will not stick thereto but will effectively bounce off. However, since the vapor pressure is proportional to a power of the temperature, lowering the temperature even from 600° C. to 120° C. will lower the vapor pressure by many orders of magnitude. In the case of Zn, lowering the temperature from 600° C. to 120° C. lowers the vapor pressure 9 orders of magnitude (from 10 Torr to $1 \times 10^8$ Torr).

Examples of other suitable high vapor materials include Mg and Cd as acceptors and S, Se and Te as donors. In the case of Te, reducing the temperature of the substrate from 600° C. to 120° C. reduces the vapor pressure by 11 orders of magnitude (from 10 Torr to $4 \times 10^{-11}$ Torr). Similarly the vapor pressure of Mg reduces by about 10 orders of magnitude (from 1 Torr to $1 \times 10^{-10}$ Torr). At temperatures of about 120° C. the vapor pressure of Te and Mg are lower than the vapor pressure of Be at the usual MBE growth temperatures (600°–700° C.). Further, at the usual growth temperatures in MBE techniques, Be has an excellent incorporation rate. Therefore, at low temperatures, around 120° C., the incorporation rates of Mg and Te into GaAs are also high. Since Mg is a well-behaved and safe acceptor, it is very desirable to use Mg, as a substitute for Be.

The low growth temperature produced some added advantages:

(a) the segregation of undesirable impurities into the grown layer is reduced;

(b) the interdiffusion between metal and semiconductor in the metal base transistors is reduced; and (c) the dopant diffusion in device structures is reduced (compared to the conventional MBE method).

Using the molecular beam epitaxy machine in the MEE method for zinc doping, instead of ion implantation, produces flatter and more abrupt doping profiles.

Another advantage of the MEE technique is that one can control the donor/acceptor characteristic of the dopant by timing the opening of the dopant shutter. For example, for silicon doping, if the Si shutter is opened simultaneously with that of the Ga shutter, the Si acts as a donor; whereas if it is opened simultaneously with the As shutter, the Si acts like an acceptor.

In doping the semiconductor with a high vapor pressure material, e.g., Zn, it is most important that the low substrate temperature is maintained during the actual deposition of the high vapor pressure material, e.g., when the high vapor pressure material shutter is open. When the high vapor pressure material beam is not being directed onto the substrate, the substrate temperature could be raised to higher temperatures, even as high as in conventional MBE techniques as long as it is lowered again before the next deposition of the high vapor pressure material. While such temperature cycling is possible within the spirit of the invention, it is presently preferred to maintain $T_s$ relatively constant at the selected low value which optimizes the sticking coefficient of the high vapor pressure material so as to avoid added time delays in heating and cooling the substrate.

It is evident that the doping of high vapor pressure materials at low $T_s$ is also applicable to other group III-V combinations such as, but not limited to: AlAs, InAs, AlGaAs, GaAs-Al-GaAs, InGaAs, InAlAs, GaSb, AlGaSb, etc. Group II-VI and IV—IV combinations are also possible. Moreover, the substrate is preferably doped or undoped GaAs, but Si may alternately be used. Further, the described process may be carried out with or without annealing steps.

Other alterations and modifications to the preferred embodiments will be apparent to those of skill in the art, and the invention is not intended to be limited to the specific embodiments described but rather to include such alteration and modifications which fall within the spirit and scope of the appended claims.

What is claimed is:

1. A method of doping a relatively high vapor pressure element into semiconductor materials, said semiconductor materials deposited on a substrate using a molecular beam epitaxy chamber, the method comprising the steps of:

1) a first diffusion step of diffusing a first semiconductor material onto said substrate to form a first diffusion layer;
2) a second diffusion step, performed after completion of said first diffusion step, of diffusing a second semiconductor material onto said first diffusion layer to form a second diffusion layer;
3) a third diffusion step of diffusing said relatively high vapor pressure element onto at least one of said first and second layers; and
4) heating the substrate to no more than a relatively low temperature during at least said third diffusion step so as to permit said relatively high vapor pressure element to bond to crystal sites of the semiconductor material.

2. A method as recited in claim 1 wherein said third diffusion step is performed temporally separate from said first and second diffusion steps.

3. A method as recited in claim 1, wherein said third diffusion step is performed simultaneously with said first diffusion step.

4. A method as recited in claim 1, wherein said third diffusion step is performed simultaneously with said second diffusion step.

5. A method as recited in claim 1, wherein said third diffusion step is performed simultaneously with said first and second diffusion steps.

6. A method as recited in claim 1, wherein said heating step is performed during each of said first, second and third diffusion steps.

7. A method as recited in claim 1, further including the step of:
5) heating said substrate during at least one of said first and second diffusion steps to a relatively high temperature with respect to step 4).

8. A method as recited in claim 7, further comprising repeating steps 1)-5) a plurality of times.

9. A method as recited in claim 1, further comprising repeating steps 1)-4) a plurality of times.

10. A method as recited in claim 1, wherein said first and second diffusion steps produce first and second monolayers respectively as said first and second diffusion layers.

11. A method as recited in claim 1, wherein said first and second semiconductor materials comprise at least one group III element and one group V element respectively.

12. A method as recited in claim 1, wherein said first and second semiconductor materials comprise at least one group II element and one group VI element respectively.

13. A method as recited in claim 1, wherein said substrate is composed also of said first and second semiconductor materials.

14. A method as recited in claim 13 wherein said first and second semiconductor materials comprise at least one group III element and one group V element respectively.

15. A method as recited in claim 1, wherein at least a top surface region of said substrate consist essentially of said first and second semiconductor materials.

16. A method as recited in claim 1, wherein said first and second semiconductor materials comprise Ga and As respectively.

17. A method as recited in claim 16, wherein said substrate comprises GaAs.

18. A method as recited in claim 16, wherein said substrate comprises doped GaAs.

19. A method as recited in claim 16, wherein said substrate comprises Si.

20. A method as recited in claim 1, wherein said substrate comprises Si.

21. A method as recited in claim 16, wherein said high vapor pressure element is Zn.

22. A method as recited in claim 21, wherein said relatively low temperature is 150° C.

23. A method as recited in claim 21, wherein said relatively low temperature is 130° C.

24. A method as recited in claim 16, further including the step of diffusing In onto at least one of said first and second diffusion layers.

25. A method as recited in claim 1, wherein said first diffusion step produces a first thermal beam of said first semiconductor material, and said method further includes the step of controlling the thermal beam of said first semiconductor material to produce a relatively low flux intensity so as to permit effective migration of said first semiconductor material on said substrate.

26. A method as recited in claim 25, wherein said first semiconductor material comprises Ga and said controlling step produces a Ga flux intensity of about $6.4 \times 10^{13}$ cm$^{-2}$s$^{-1}$.

27. A method as recited in claim 26, wherein said controlling step produces said Ga flux intensity for a period of about 10 seconds.

28. A method as recited in claim 26, wherein said second semiconductor material comprises As and wherein said second diffusion step produces a second thermal beam of said second semiconductor material, and said method further includes the step of controlling the As thermal beam to produce a flux intensity of about $1.7 \times 10^{14}$ cm$^{-2}$s$^{-1}$.

29. A method as recited in claim 27, wherein said second semiconductor material comprises As and wherein said second diffusion step produces a second thermal beam of said second semiconductor material, and said method further includes the step of controlling the As thermal beam to produce a flux intensity of about $1.7 \times 10^{14}$ cm$^{-2}$s$^{-1}$.

30. Method for doping a relatively high vapor pressure element into a semiconducting material deposited on a substrate using a molecular beam epitaxy chamber, said material being of good quality compared to that obtained at a conventional high temperature, the method comprising the steps of
(a) depositing said semiconducting material on a substrate by means of migration enhanced epitaxy, and
(b) depositing said element in vaporized state on a substrate having a relatively low temperature so that said element bonds to said semiconducting material.

31. Method of claim 30 wherein said element is selected from zinc, magnesium, cadmium, sulfur, selenium, tellurium and mixtures thereof and wherein deposition of said semiconducting material is accomplished at a rate of 0.05 to 0.2 micrometers per hour.

32. Method of claim 30 wherein said element is zinc, said relatively low substrate temperature is in the range of 100° to 150° C., and deposition of said semiconducting material is accomplished at a rate of 0.05 to 0.2 micrometers per hour.

* * * * *